United States Patent [19]
Tsukude et al.

[11] Patent Number: 5,894,440
[45] Date of Patent: Apr. 13, 1999

[54] SEMICONDUCTOR MEMORY DEVICE AND DATA TRANSFERRING STRUCTURE AND METHOD THEREIN

[75] Inventors: Masaki Tsukude; Kazutami Arimoto; Kazuyasu Fujishima; Yoshio Matsuda; Tsukasa Ooishi, all of Hyogo-ken, Japan

[73] Assignee: Mitsubishi Denki Kabushiki Kaisha, Tokyo, Japan

[21] Appl. No.: 08/189,276

[22] Filed: Jan. 31, 1994

Related U.S. Application Data

[63] Continuation of application No. 07/938,582, Sep. 2, 1992, abandoned, which is a continuation of application No. 07/735,684, Jul. 29, 1991, abandoned, which is a continuation of application No. 07/441,588, Nov. 27, 1989, abandoned.

[30] Foreign Application Priority Data

Nov. 29, 1988 [JP] Japan .................. 63-302841

[51] Int. Cl.$^6$ ........................... G11C 7/06
[52] U.S. Cl. ............... 365/190; 365/189.05; 365/194; 365/207; 365/233
[58] Field of Search ............... 365/51, 63, 149, 365/154, 174, 189.05, 190, 205, 207, 194, 233

[56] References Cited

U.S. PATENT DOCUMENTS

| | | | |
|---|---|---|---|
| 4,330,852 | 5/1982 | Redwine et al. | 365/221 |
| 4,498,155 | 2/1985 | Rao | 365/230.09 |
| 4,541,075 | 9/1985 | Dill et al. | 365/189.04 |
| 4,590,588 | 5/1986 | Ihoh et al. | 365/51 |
| 4,675,845 | 6/1987 | Itoh et al. | 365/51 |
| 4,757,473 | 7/1988 | Kurihara et al. | 365/189.12 |
| 4,757,477 | 7/1988 | Nagayama et al. | 365/230.05 |
| 4,758,987 | 7/1988 | Sakui | 365/203 |
| 4,777,625 | 10/1988 | Sakui et al. | 365/207 |
| 4,791,616 | 12/1988 | Taguchi et al. | 365/205 |
| 4,819,207 | 4/1989 | Sakui et al. | 365/222 |
| 4,825,411 | 4/1989 | Hamano | 365/189.04 |
| 4,839,868 | 6/1989 | Sato et al. | 365/230.06 |
| 4,855,959 | 8/1989 | Kobayashi | 365/239 |
| 4,879,692 | 11/1989 | Tokushige | 365/230.03 |
| 4,891,795 | 1/1990 | Pinkham et al. | 365/230.03 |
| 4,899,310 | 2/1990 | Baba et al. | 365/189.05 |
| 4,912,678 | 3/1990 | Mashiko | 365/222 |
| 4,914,630 | 4/1990 | Fujishima et al. | 365/189.04 |
| 4,916,671 | 4/1990 | Ichiguchi | 365/233 |
| 4,931,994 | 6/1990 | Matsui et al. | 365/189.01 |
| 4,933,907 | 6/1990 | Kumanoya et al. | 365/222 |
| 4,937,788 | 6/1990 | Harada | 365/189.04 |
| 4,941,129 | 7/1990 | Oshima et al. | 365/230.03 |
| 4,970,685 | 11/1990 | Koyanagi | 365/51 |

FOREIGN PATENT DOCUMENTS 242252  10/1987  Japan .

OTHER PUBLICATIONS

Nikkei Electronics 1985 (pp. 211–240).
"A CMOS Dual Port Memory with Serial Read/Write Function for Graphic Systems", K. Mashiko et al., pp. 636–643, IEEE Transactions on Consumer Electronics, vol. CE–32, No. 3, Aug. 1986.
Pinkham et al, "A High Speed Dual Port Memory with Simultaneous Serial and Random Mode Access for Video Applications", IEEE Journal of Solid–State Circuits, vol. SC–19, No. 6 (Dec. 1984) pp. 999–1007.

Primary Examiner—Jack A. Lane
Attorney, Agent, or Firm—McDermott, Will & Emery

[57] ABSTRACT

Each of divided bit line pairs is selectively connected to a sub-input/output line pair through transfer gates. A register is connected to the sub-input/output line pair. Data is transferred through the sub-input/output line pair between the register and a selected bit line pair. A sense amplifier is connected to each of the bit line pairs. Sense amplifiers are independently driven by separate sense amplifier activating signals. Therefore, even if data is transferred to the selected bit line pair from the register, fluctuations in potential on the bit line pair caused in such a case does not affect a sense amplifier activating signal connected to a non-selected bit line pair. As a result, data stored in the non-selected memory cell is prevented from being destroyed.

10 Claims, 13 Drawing Sheets

SEMICONDUCTOR MEMORY DEVICE AND DATA TRANSFERRING STRUCTURE AND METHOD THEREIN

This application is a continuation of application Ser. No. 07/938,582 filed Sep. 2, 1992, now abandoned, which is a continuation of application Ser. No. 07/735,684 filed Jul. 29, 1991, now abandoned, which is a continuation of application Ser. No. 07/441,588 filed Nov. 27, 1989, now abandoned.

BACKGROUND OF THE INVENTION

1. Field of the Invention

The present invention relates generally to semiconductor memory devices and a data transferring method therein, and more particularly, to a semiconductor memory device having a hierarchical organization in which a plurality of bit line pairs are connected to a sub-input/output line pair through transfer gates and a register for storing data is connected to the sub-input/output line pair and a method for transferring data from the register to memory cells.

2. Description of the Background Art

FIG. 1 is a partial circuit diagram showing a structure of a conventional two-port memory device, showing a portion corresponding to a pair of bit lines. In FIG. 1, this two-port memory device comprises a random access memory (RAM) portion and a serial access memory (SAM) portion. The two memory portions are connected to each other by transfer gates 1. On-off control of the transfer gates 1 is performed in response to a transfer gate control signal TG. The SAM portion comprises a register 2 having a latching function. The RAM portion comprises a sense amplifier 3, a bit line pair BL and $\overline{BL}$, word lines $WL_1$, $WL_2$, ..., memory cells MC each having a transfer gate 4 for memory cell and a capacitor 5 for memory cell, and bit line precharging transistors 6. The sense amplifier 3 is activated by sense amplifier activating signals SAE and $\overline{SAE}$, to amplify and detect a very small potential difference between the bit line pair BL and $\overline{BL}$. On-off control of each of the transfer gates 4 is controlled by selecting or non-selecting a corresponding word line. Each of the bit line precharging transistors 6 is turned on when a bit line precharging signal BLP is activated, to precharge the bit line pair BL and $\overline{BL}$ at a precharge voltage $V_{BL}$.

Referring now to a timing chart of FIG. 2, description is made on an operation for transferring and writing data to memory cells from the register 2 shown in FIG. 1.

First, at the time t1, the transfer gate control signal TG becomes the "H" level, so that the transfer gates 1 are turned on. Consequently, data stored in the register 2 is transmitted to the bit line pair BL and $\overline{BL}$ through the transfer gates 1. On this occasion, in the RAM portion, when the bit line pair BL and $\overline{BL}$ is being precharged, the data stored in the register 2 is destroyed. Thus, the transfer gate control signal TG is adapted to be the "H" level after the bit line precharging signal BLP becomes the "L" level so that the bit line pair BL and $\overline{BL}$ are electrically isolated from each other.

After the data stored in the register 2 is transmitted to the bit line pair BL and $\overline{BL}$, a potential on the word line WL is raised at the time t2, so that the transfer gate 4 is turned on. Thereafter, at the time t3, the sense amplifier activating signals SAE and $\overline{SAE}$ are respectively brought to the "H" and "L" levels, so that the sense amplifier 3 is activated. Consequently, the data transmitted onto the bit line pair BL and $\overline{BL}$, i.e., the data stored in the register 2 is written into the memory cell MC.

In the above described semiconductor memory device in which a single register 2 is connected to each bit line pair through a pair of transfer gates 1, data can be transferred from the register 2 to memory cells MC according to the above described transferring method.

Meanwhile, in the semiconductor memory device shown in FIG. 1, the number of memory cells MC connected to a single bit line pair BL and $\overline{BL}$ is large, so that parasitic capacitance of each bit line is increased, whereby the number of read errors is increased.

Therefore, it is considered that a single bit line pair is divided into a plurality of bit line pairs, each of the divided bit line pairs is connected to a single sub-input/output line pair through transfer gates, and data is transferred to or from a data register through this sub-input/output line pair, so that parasitic capacitance of each of the bit line pairs is decreased, whereby the number of read errors is decreased. An example of a semiconductor memory device fabricated based on such an idea is shown in FIG. 3.

In the semiconductor memory device shown in FIG. 3, a single register 2 corresponds to two bit line pairs $BL_1$ and $\overline{BL_1}$ and $BL_2$ and $\overline{BL_2}$ (a single register may correspond to three or more bit line pairs). Sense amplifiers $3_1$ and $3_2$ are respectively connected to the bit line pairs $BL_1$ and $\overline{BL_1}$ and $BL_2$ and $\overline{BL_2}$. The sense amplifiers $3_1$ and $3_2$ are activated by common sense amplifier activating signals SAE and $\overline{SAE}$. In addition, the bit line pair $BL_1$ and $\overline{BL_1}$ is connected to a sub-input/output line pair sub.-I/O and sub.-$\overline{I/O}$ through a transfer gate $7_1$, and the bit line pair $BL_2$ and $\overline{BL_2}$ is connected to a sub-input/output line pair sub.-I/O and sub.-$\overline{I/O}$ through a transfer gate $7_2$. The sub-input/output line pair sub.-I/O and sub.-$\overline{I/O}$ is connected to the register 2 through transfer gates 1. The register 2 is connected to an input/output line pair I/O and $\overline{I/O}$ through I/O transfer gates 8. On-off control of the I/O transfer gates 8 is controlled by an output signal Yi from a column decoder (not shown).

The above described semiconductor memory device shown in FIG. 3 is adapted such that the transfer gates $7_1$ and $7_2$ are selectively turned on in response to sense amplifier connect signals SAC1 and SAC2, so that one of the two bit line pairs is connected to the sub-input/output line pair sub.-I/O and sub.-$\overline{I/O}$, whereby data stored in the register 2 is transferred to a memory cell connected to one bit line of a desired bit line pair.

Meanwhile, in the semiconductor memory device shown in FIG. 3, if and when data is transferred from the register 2 to a memory cell connected to one of the plurality of bit line pairs $BL_1$ and $\overline{BL_1}$ and $BL_2$ and $\overline{BL_2}$, data stored in a memory cell connected to bit lines of a non-selected bit line pair, i.e., a bit line pair to which data is not transferred is liable to be destroyed, that is, data opposite to the stored data is liable to be stored. When transient occurs on the bit line $BL_1$, it is coupled onto SAE and $\overline{SAE}$ lines by the sense amplifier $3_1$ of thence to the sense amplifier $3_2$. If large enough to activate the sense amplifier $3_2$ during unbalanced capacitive coupling of $BL_1$+$BL_2$, data is destroyed. This will be described with reference to a timing chart of FIG. 4.

As an example, let us consider a case in which the data stored in the register 2 is transferred to a memory cell $MC_{11}$ connected to the bit line $BL_1$ of the bit line pair $BL_1$ and $\overline{BL_1}$ and selected by a word line $WL_1$. Meanwhile, in the initial state, it is assumed that the sub-input/output lines sub.-I/O and sub.-$\overline{I/O}$ are respectively brought to the "H" and "L" levels depending on the data stored in the register 2, and "L" level data are stored in memory cells $MC_{11}$ and $MC_{12}$ respectively connected to the bit lines $BL_1$ and $\overline{BL_1}$ out of memory cells selected by the word line $WL_1$, as well as in memory cells $MC_{21}$ and $MC_{22}$ respectively connected to the bit lines $BL_2$ and $\overline{BL_2}$.

3

First, when a column address strobe signal $\overline{CAS}$ falls at the time t1, the sense amplifier connect signal SAC1 rises at the time t2 in order to connect the sub-input/output line pair sub.-I/O and sub.-$\overline{I/O}$ to the bit line pair $BL_1$ and $\overline{BL_1}$. Consequently, a pair of transfer gates $7_1$ is turned on, so that the data stored in the register 2 is transferred to the bit line pair $BL_1$ and $\overline{BL_1}$. Meanwhile, since a bit line pair connected to the sub-input/output line pair sub.-I/O and sub.-$\overline{I/O}$ is selected based on information stored in a column address for selecting a bit line pair, the sense amplifier connect signal SAC1 corresponding to the bit line pair $BL_1$ and $\overline{BL_1}$ to be selected after the column address strobe signal $\overline{CAS}$ rises.

Thereafter, at the time t3, a potential on the word line $WL_1$ rises, so that the data stored in the memory cells $MC_{11}$ and $MC_{21}$ connected to the word line $WL_1$ are read out onto the bit line pair $BL_1$ and $BL_2$. In this case, since current driving capability based on the register 2 is larger than that based on the data stored in the memory cell $MC_{11}$, the data stored in the register 2 is maintained. Meanwhile, in order to shorten a period during which a bit line pair is electrically floating (that is, to shorten a period from t3 to t4 which elapses until a sensing operation is initiated) after the potential on the word line $WL_1$ is raised, the potential on the word line $WL_1$ is raised after the sense amplifier connect signal SAC1 rises. Thereafter, at the time t4, the sense amplifier activating signals SAE and $\overline{SAE}$ respectively become the "H" and "L" levels. Accordingly, the sense amplifiers $3_1$ and $3_2$ are activated, which respectively amplify and detect potential differences between the bit line pair $BL_1$ and $\overline{BL_1}$ and $BL_2$ and $\overline{BL_2}$.

Meanwhile, when the data stored in the register 2 is transferred to the selected bit line pair $BL_1$ and $\overline{BL_1}$ at the time t2, noises are included in the sense amplifier activating signals SAE and $\overline{SAE}$ due to capacitive coupling of transistors constituting the sense amplifier $3_1$. During a period from t2 to t3, the sense amplifier activating signals SAE and $\overline{SAE}$ fluctuate due to the noises until the sense amplifier can be activated. The sense amplifier $3_2$ is then activated, so that the potential difference between the bit line pair $BL_2$ and $\overline{BL_2}$ is amplified. On this occasion, the data stored in the memory cell $MC_{21}$ has not read out onto the bit line $BL_2$ yet. Thus, the bit line pair $BL_2$ and $\overline{BL_2}$ remain at a precharge voltage $V_{BL}$, so that the potential difference therebetween should not exist. However, when there exist imbalance between potentials on bit lines caused by parasitic capacitance of each bit line and the dissymmetry of amplification sensitivity which inherently exists in the sense amplifier $3_2$, the sense amplifier $3_2$ undesirably amplifies the potential difference between the bit line pair $BL_2$ and $\overline{BL_2}$. If the potential difference between the bit line pair $BL_2$ and $\overline{BL_2}$ amplified by the sense amplifier $3_2$ is contrary to a potential difference based on data read out from the memory cell $MC_{21}$ selected by the word line $WL_1$, the data stored in the selected memory cell is inverted, i.e., destroyed.

As described in the foregoing, in the semiconductor memory device shown in FIG. 3, data in a memory cell belonging to a non-selected bit line pair, i.e., a bit line pair to which data is inhibited from being transferred is undesirably destroyed.

SUMMARY OF THE INVENTION

An object of the present invention is to solve the above described problems and to provide a semiconductor memory device in which in transferring data from a register to a memory cell, fluctuations in potential difference between a bit line pair caused by the transferred data do not affect a sense amplifier connected to a non-selected bit line pair.

4

Another object of the present invention is to provide a data transferring method in the above described semiconductor memory device, by which data is transferred from a register to a selected memory cell without undesirably destroying data in a memory cell belonging to a non-selected bit line pair.

In the semiconductor memory device according to the present invention, a plurality of independent sense amplifier activating signals are respectively outputted to sense amplifiers from control means, and the plurality of sense amplifier activating signals are individually applied to the sense amplifiers by a plurality of sense amplifier activating signal applying means. As a result, even if data stored in a register is transferred to a selected bit line pair, a potential difference produced between the bit line pair does not affect a sense amplifier connected to another non-selected bit line pair.

In a data transferring method in the semiconductor memory device according to the present invention, data stored in a register is first transferred to a selected bit line pair, data stored in a memory cell is read out by driving a word line and then, each of sense amplifiers is activated.

In accordance with another aspect of the present invention, in a data transferring method in a semiconductor memory device, data stored in a memory cell is read out by driving a word line, each of sense amplifiers is activated and then, data stored in a register is transferred to a selected bit line pair. In this case, activation of a sense amplifier corresponding to the selected bit line pair is stopped while data is transferred to the selected bit line pair from the register, whereby the data stored in the register is prevented from being destroyed.

As described in the foregoing, according to the present invention, sense amplifiers respectively belonging to divided bit line pairs are independently driven in response to separate sense amplifier activating signals, so that data stored in a memory cell belonging to a non-selected bit line pair can be prevented from being undesirably destroyed in transferring data from a register to a memory cell belonging to a selected bit line pair.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
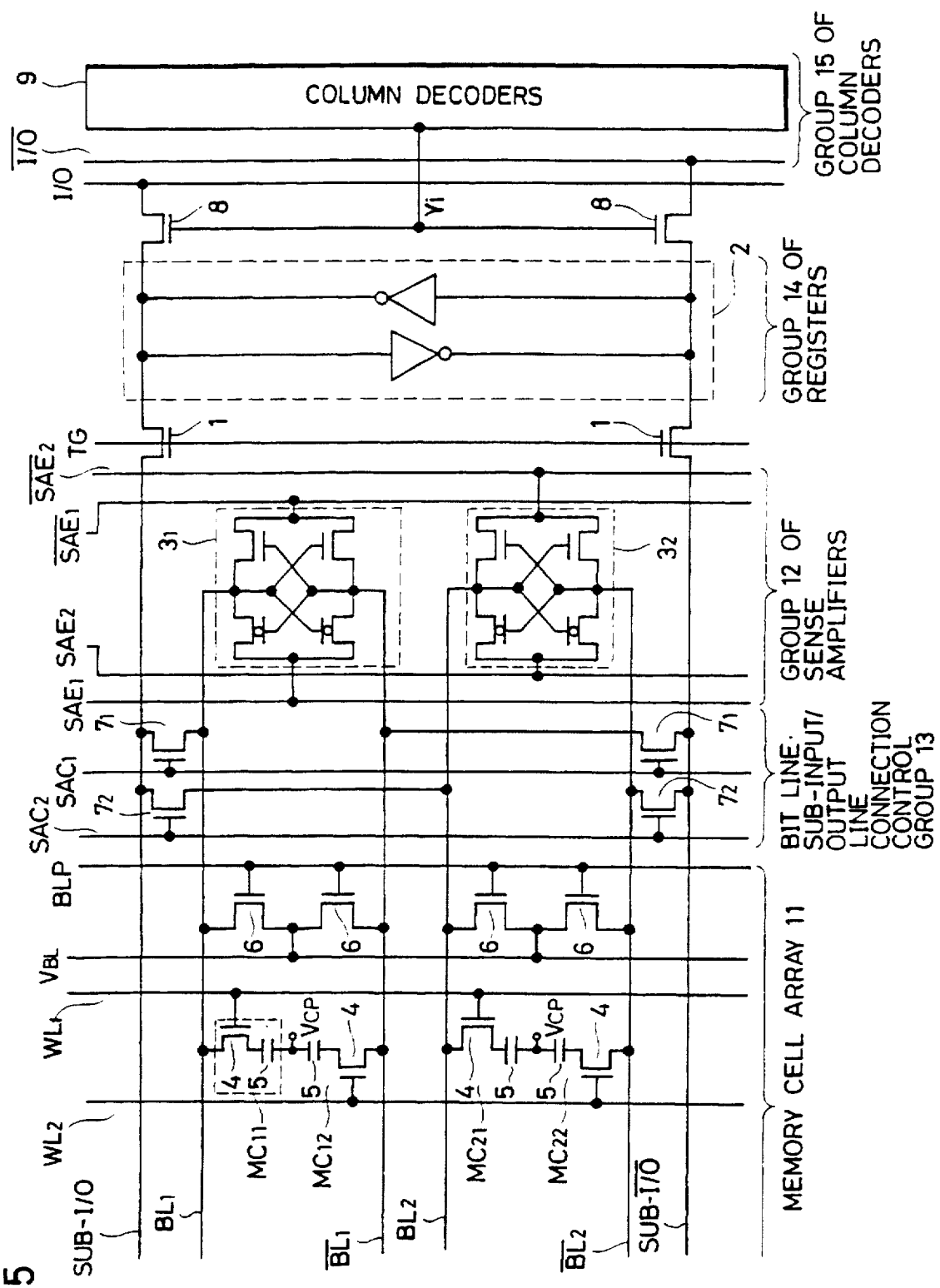
FIG. 5 is a circuit diagram showing a main portion of the semiconductor memory device according to first and second embodiments of the present invention.

FIG. 5 is a circuit diagram showing a main portion of a semiconductor memory device according to a first embodiment of the present invention. In the embodiment shown in FIG. 5, sense amplifiers $3_1$ and $3_2$ are independently driven. More specifically, the sense amplifier $3_1$ is activated by sense amplifier activating signals SAE1 and $\overline{SAE1}$, and the sense amplifier $3_2$ is activated by sense amplifier activating signals SAE2 and $\overline{SAE2}$. The structure of the semiconductor memory device except for the foregoing is the same as that of the conventional semiconductor memory device shown in FIG. 3, and corresponding portions have the same reference numerals and hence, the description thereof is omitted in the following description of FIG. 5.

Figure 6:
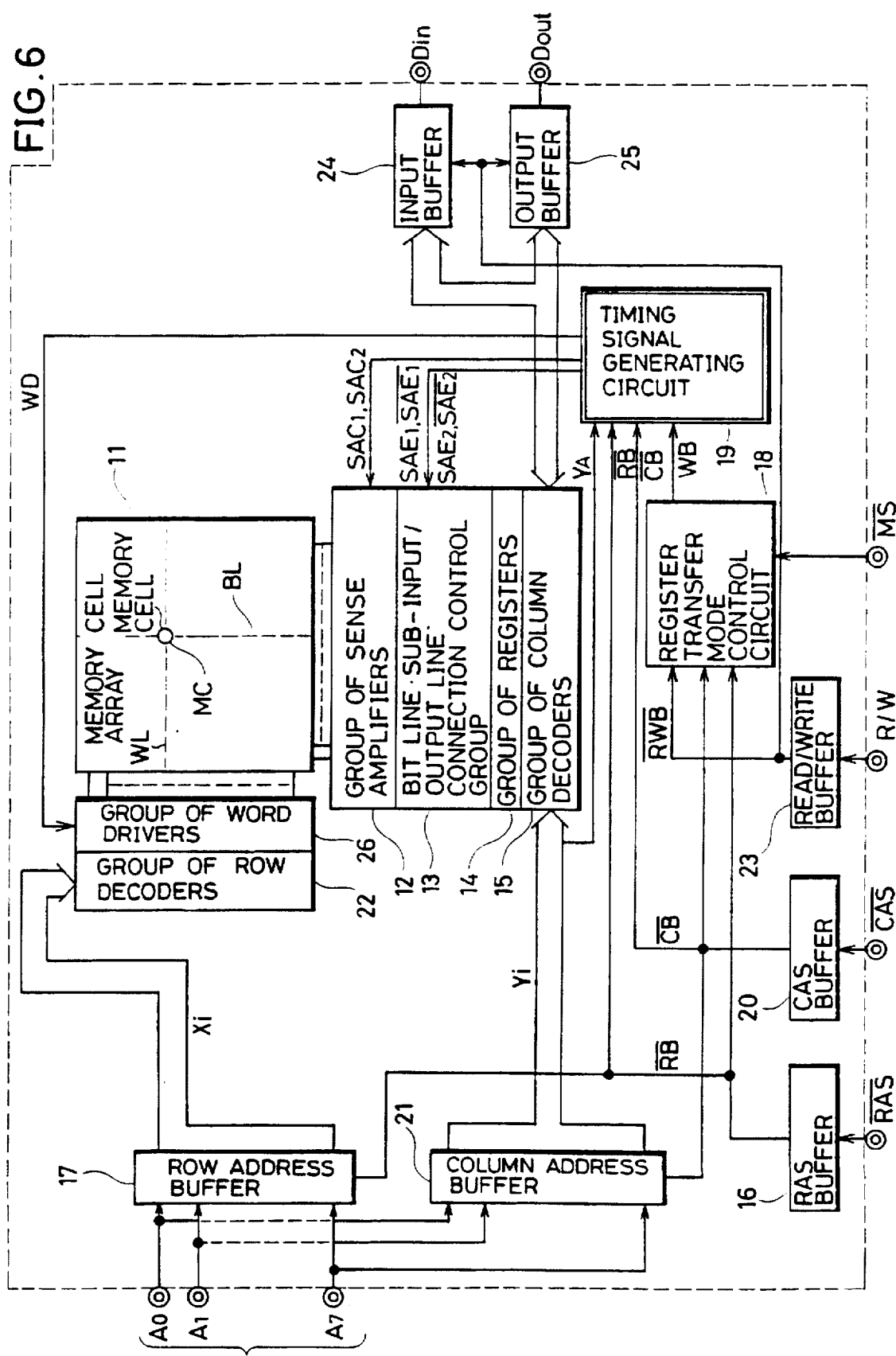
FIG. 6 is a block diagram showing an entire structure of the semiconductor memory device according to the first embodiment of the present invention.

FIG. 6 is a block diagram showing an entire structure of the semiconductor memory device according to the embodiment shown in FIG. 5. FIG. 6 shows, as an example, a 64K-bit semiconductor memory device having eight address inputs $A_0$ to $A_7$. In FIG. 6, a memory cell array 11, a group 12 of sense amplifiers, a group 13 for controlling connection of bit lines to a sub-input/output line pair, a group 14 of registers, and a group 15 of column decoders correspond to the circuit shown in FIG. 5. In the lower part of FIG. 5, the relation corresponding to FIG. 6 is shown. Although in FIG. 5, only a circuit associated with a single sub-input/output line pair sub.-I/O and sub.-$\overline{I/O}$ is shown, a plurality of similar circuits exist to constitute a group as shown in FIG. 6. A RAS buffer 16 outputs a signal $\overline{RB}$ in response to an externally applied row address strobe signal $\overline{RAS}$. This signal $\overline{RB}$ is inputted to a row address buffer 17, a register transfer mode control circuit 18 and a timing signal generating circuit 19. A CAS buffer 20 outputs a signal $\overline{CB}$ in response to an externally applied column address strobe signal $\overline{CAS}$. This signal $\overline{CB}$ is inputted to a column address buffer 21, the register transfer mode control circuit 18 and the timing signal generating circuit 19. Address signals $A_0$ to $A_7$ are divided into a row address signal Xi and a column address signal Yi in response to the signals $\overline{RB}$ and $\overline{CB}$ in the row address buffer 17 and the column address buffer 21, to be respectively applied to a group 22 of row decoders and the group 15 of column decoders. Consequently, rows and columns in the memory cell array 11 are selected. A read/write buffer 23 outputs a signal $\overline{RWB}$ in response to an externally applied read/write strobe signal R/W. This signal $\overline{RWB}$ is inputted to an input buffer 24, an output buffer 25 and the register transfer mode control circuit 18. Each of the circuits is switched between a data read mode and a data write mode. An externally applied mode select signal $\overline{MS}$ is used for defining switching between an ordinary read/write mode and a register transfer mode in which data in the group 14 of registers are transferred to memory cells, which is applied to the register transfer mode control circuit 18. The register transfer mode control circuit 18 generates a mode selecting signal WB for selecting between the register transfer mode and the ordinary read/write mode in response to the signals $\overline{RB}$, $\overline{CB}$, $\overline{RWB}$ and $\overline{MS}$. The timing signal generating circuit 19 generates sense amplifier activating signals SAE1 and $\overline{SAE1}$ and SAE2 and $\overline{SAE2}$, sense amplifier connect signals SAC1 and SAC2, and a clock signal WD for driving a word line selected by the row address signal Xi, upon receipt of the signals $\overline{RB}$ and $\overline{CB}$, one $Y_A$ of the column address signals and the signal WB. Meanwhile, the clock signal WD is applied to a group 26 of word drivers.

Figure 7:
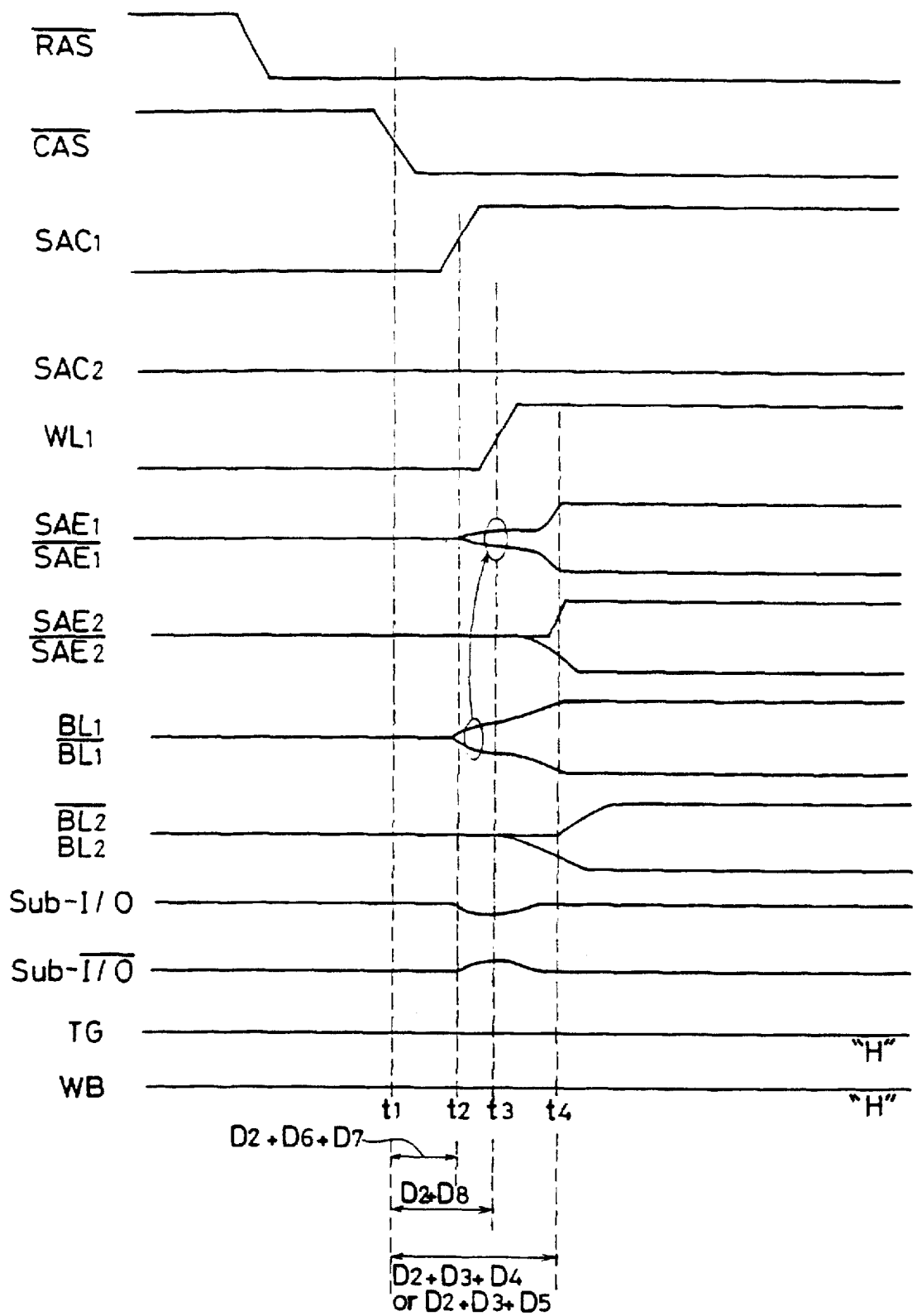
FIG. 7 is a timing chart for explaining an operation of the semiconductor memory device according to the first embodiment of the present invention.

Referring now to a timing chart of FIG. 7, description is made on an operation of the semiconductor memory device according to the first embodiment shown in FIGS. 5 and 6. As an example, let us consider a case in which data stored in the register 2 is transferred to a memory cell $MC_{11}$ selected by a word line $WL_1$ and connected to a bit line $BL_1$. Meanwhile, in the initial state, sub-input/output lines sub. I/O and sub. $\overline{I/O}$ respectively become the "H" and "L" levels based on the data stored in the register 2, and "L" level data are stored in both memory cells $MC_{11}$ and $MC_{21}$ selected by the word line $WL_1$.

First, at the time t1, the column address strobe signal $\overline{CAS}$ falls, so that the CAS buffer 20 outputs the signal $\overline{CB}$. At the time t2, the timing signal generating circuit 19 raises a sense amplifier connect signal in response to the signal $\overline{CB}$. On this occasion, the timing signal generating circuit 19 raises only the sense amplifier connect signal SAC1 in response to the column address signal $Y_A$ applied from the column address buffer 21 for selecting the bit line pair $BL_1$ and $\overline{BL_1}$. Consequently, a transfer gate $7_1$ is turned on, so that the sub-input/output line pair sub.-I/O and sub.-$\overline{I/O}$ is connected to the bit line pair $BL_1$ and $\overline{BL_1}$. Thus, data stored in the register 2 is transferred to the bit line pair $BL_1$ and $\overline{BL_1}$. Thereafter, at the time t3, the timing signal generating circuit 19 generates the clock signal WD, to apply the same to the group 26 of word drivers. On this occasion, the group 26 of word drivers raises a potential on the word line $WL_1$ selected by the group 22 of row decoders in response to the row address signal Xi from the row address buffer 17. Thus, data stored in the memory cells $MC_{11}$ and $MC_{21}$ selected by the word line $WL_1$ are read out onto the bit line pair $BL_1$ and $BL_2$.

Figure 1:
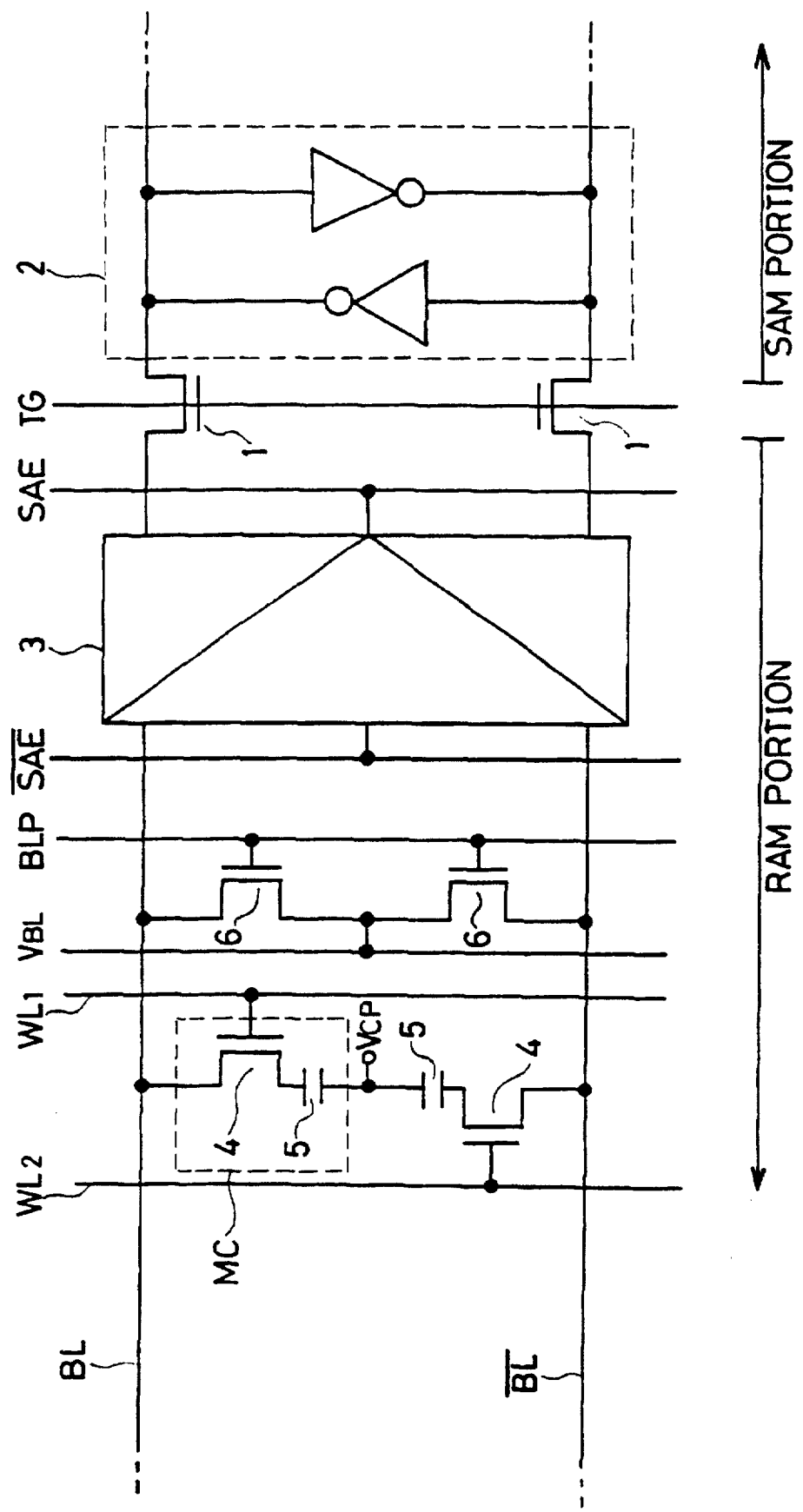
FIG. 1 is a circuit diagram showing a structure of a conventional two-port memory device.
Figure 2:
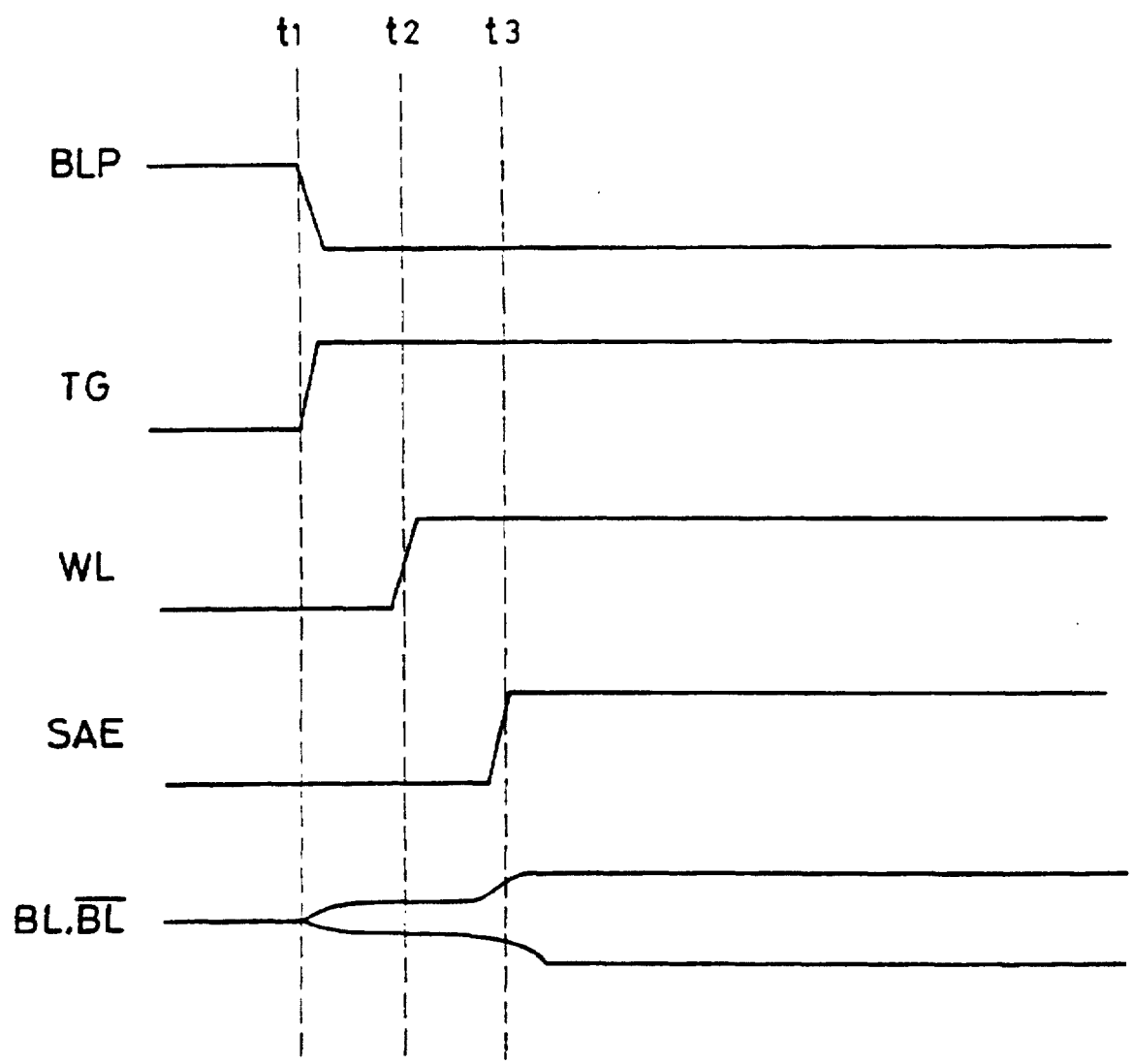
FIG. 2 is a timing chart for explaining an operation of the conventional device shown in FIG. 1.
Figure 3:
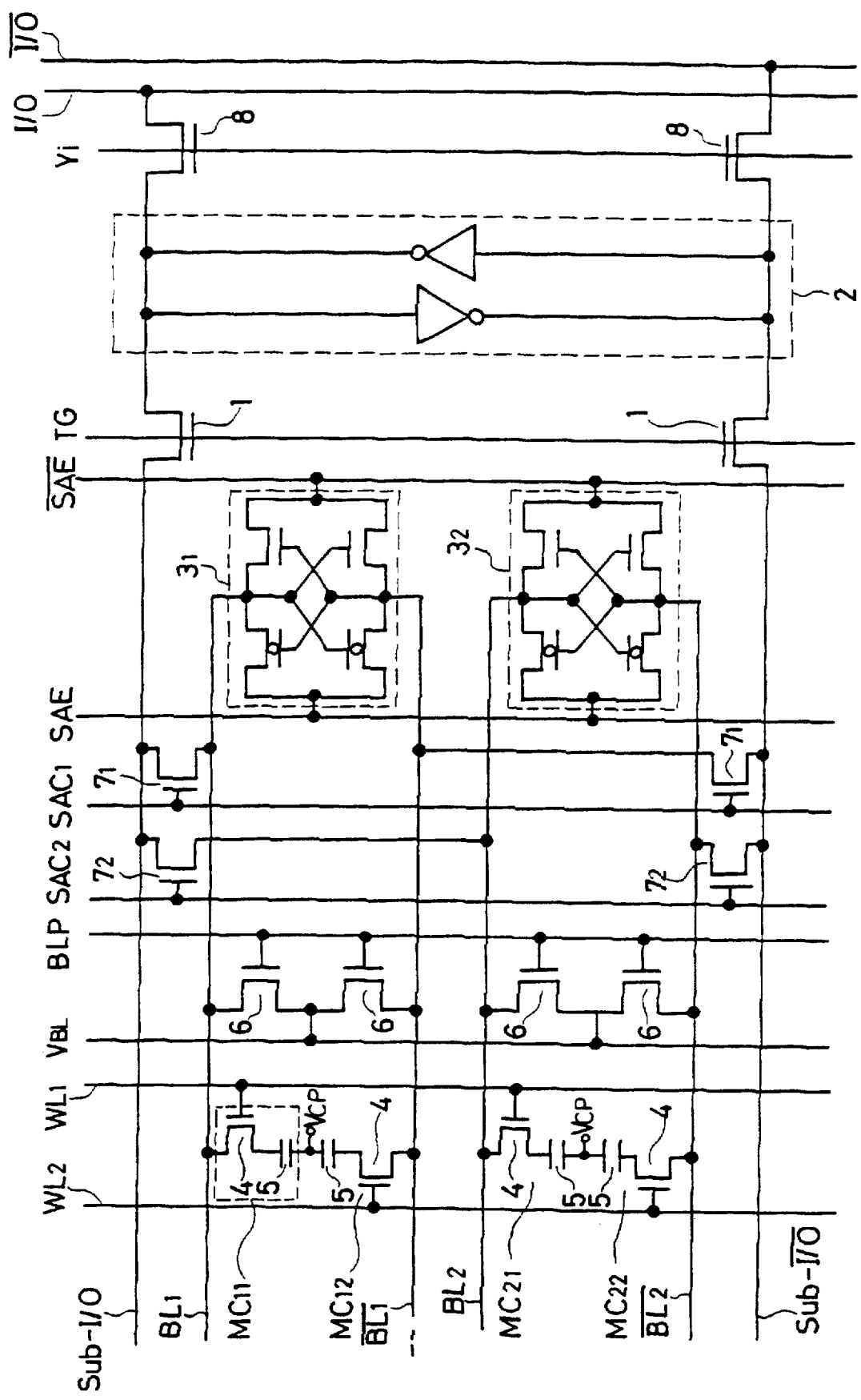
FIG. 3 is a circuit diagram showing one example of a semiconductor memory device which is not prior art but is considered to be the background of the present invention.
Figure 4:
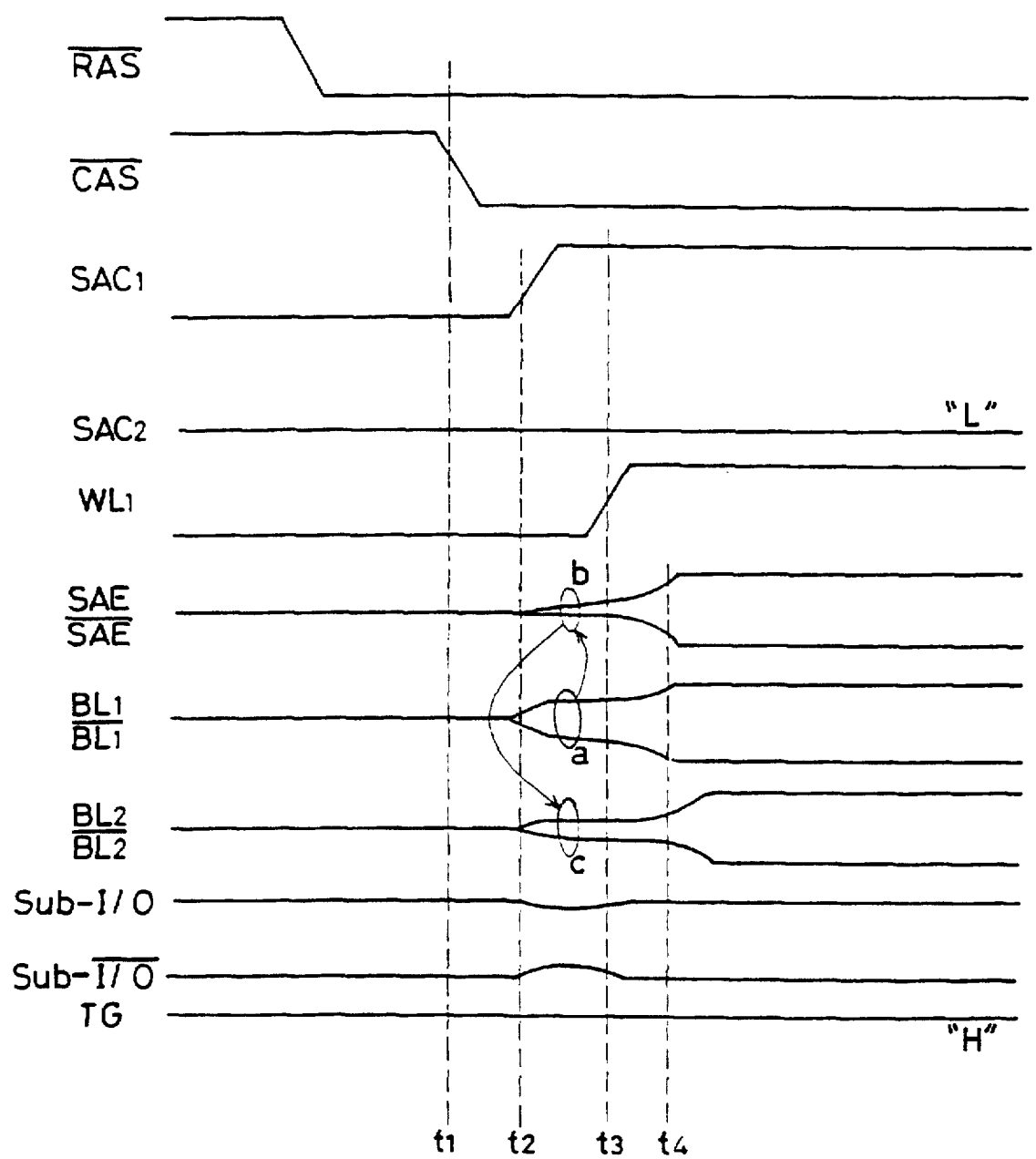
FIG. 4 is a timing chart for explaining an operation of the semiconductor memory device shown in FIG. 3.

In the semiconductor memory device and the data transferring method therein as shown in FIGS. 3 and 4, when the sense amplifier connect signal SAC1 rises so that the data stored in the register 2 is transferred to the bit line pair $BL_1$ and $\overline{BL_1}$ (a), a sense amplifier activating signal SAE associated with a non-selected bit line pair $BL_2$ and $\overline{BL_2}$ is affected (b) by the coupling action of transistors constituting the sense amplifier $3_1$, so that data stored in a non-selected memory cell is destroyed (c). On the other hand, in the embodiment as shown in FIGS. 5 and 6, the sense amplifier $3_1$ connected to the selected bit line pair $BL_1$ and $\overline{BL_1}$ and the sense amplifier $3_2$ connected to the non-selected bit line pair $BL_2$ and $\overline{BL_2}$ are respectively driven by the activating signals SAE1 and $\overline{SAE1}$ and SAE2 and $\overline{SAE2}$. Consequently, the coupling (c) of FIG. 4 is removed in this embodiment, and therefore, even if the data stored in the register 2 is transferred to the bit line pair $BL_1$ and $\overline{BL_1}$, the sense amplifier activating signals SAE2 and $\overline{SAE2}$ are not affected. Thus, at the time t4, when the sense amplifier activating signals SAE1 and $\overline{SAE1}$ and SAE2 and $\overline{SAE2}$ are activated, the sense amplifier $3_1$ reliably detects the data stored in the register 2 while the sense amplifier $3_2$ detects data read out from the memory cell $MC_{21}$. Meanwhile, at time t4, as an additional benefit of the invention, the memory cell $MC_{21}$ is refreshed by activation of the sense amplifier $3_2$.

Figure 8:
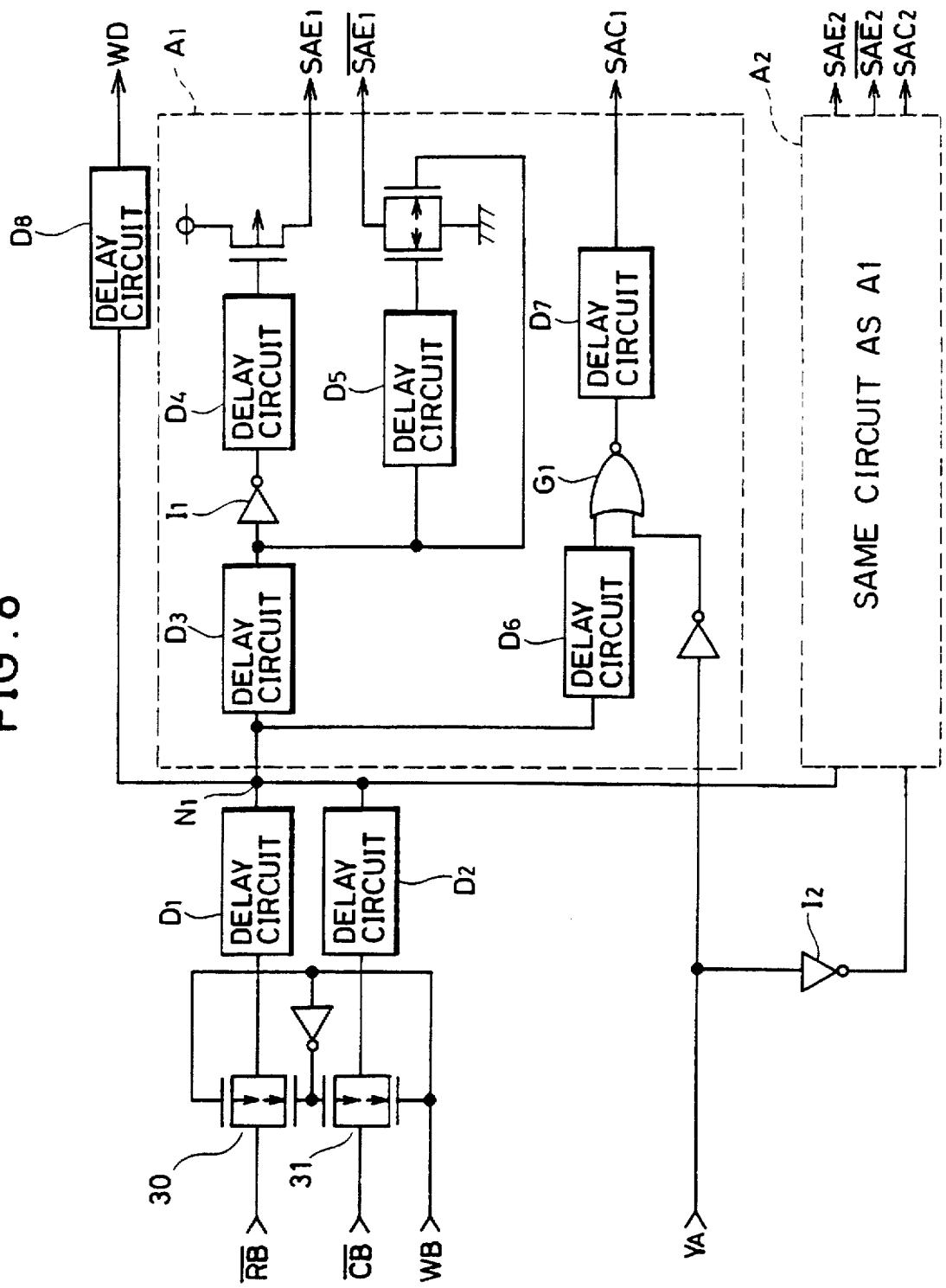
FIG. 8 is a circuit diagram showing one example of a structure of a timing signal generating circuit 19 shown in FIG. 6.

FIG. 8 is a circuit diagram showing one example of a structure of the timing signal generating circuit 19 shown in FIG. 6. Referring now to FIG. 8, the timing signal generating circuit 19 will be described in detail. It is assumed here that a signal WB is in the "H" level state in order to transfer data stored in a register 2 to a memory cell (the signal WB is in an ordinary read/write mode when it is in the "L" level state). The signal WB is at the "H" level, a CMOS switch 30 is turned off while a CMOS switch 31 is turned on. Therefore, a signal $\overline{CB}$ is selected, to be sent to a node N1 thorough a delay circuit D2. Consequently, a signal WD to be a clock signal for raising a potential on a word line rises at timings delayed by delay times of delay circuits D2 and D8 (the time t3 in FIG. 7) after the fall of a column address strobe signal $\overline{CAS}$. In addition, a signal at the node N1 passes through a delay circuit D3, an inverter I1 and a delay circuit D4, so that a sense amplifier activating signal SAE1 is produced. Furthermore, the signal at the node N1 passes through delay circuits D3 and D5, so that a sense amplifier activating signal $\overline{SAE1}$ is produced. A sense amplifier connect signal SAC1 is generated by NORing by a NOR gate G1 a signal obtained by delaying the signal at the node N1 by a delay circuit D6 and an inverted signal of one $Y_A$ of column address signals and delaying an output of the NOR gate G1 by a delay circuit D7. Meanwhile, a circuit A2 is similar to a circuit A1 enclosed by a dotted line. Sense amplifier activating signals SAE2 and $\overline{SAE2}$ and a sense amplifier connect signal SAC2 are generated from this circuit A2. One $Y_A$ of column address signals is inputted to this circuit A2 with it being inverted by an inverter I2. Thus, if and when the signal $Y_A$ is at, for example, the "H" level, the sense amplifier connect signal SAC1 rises (the time t2 in FIG. 7) to the "H" level while the sense amplifier connect signal SAC2 remains at the "L" level. Meanwhile, as shown in FIG. 7, timings at which the column address strobe signal $\overline{CAS}$ falls, a potential on a word line $WL_1$ rises, the sense amplifier connect signal SAC1 rises and then, the sense amplifier activating signals SAE1 and $\overline{SAE1}$ and SAE2 and $\overline{SAE2}$ are activated. These are all achieved by suitably selecting the delay time of each of the delay circuits in the circuit shown in FIG. 8.

The second embodiment of the present invention will now be described. First, a main portion of a semiconductor memory device according to the second embodiment has the same structure as the circuit shown in FIG. 5. More specifically, in the second embodiment, sense amplifiers connected to divided bit line pairs are respectively driven by separate sense amplifier activating signals, similarly to the above described first embodiment (shown in FIGS. 5 to 8). However, in the second embodiment, a major circuit shown in FIG. 5 is operated at different timings from those in the first embodiment. Therefore, changes for producing different operation timings are made in a circuit in the vicinity of the major circuit as shown in FIG. 9.

Figure 9:
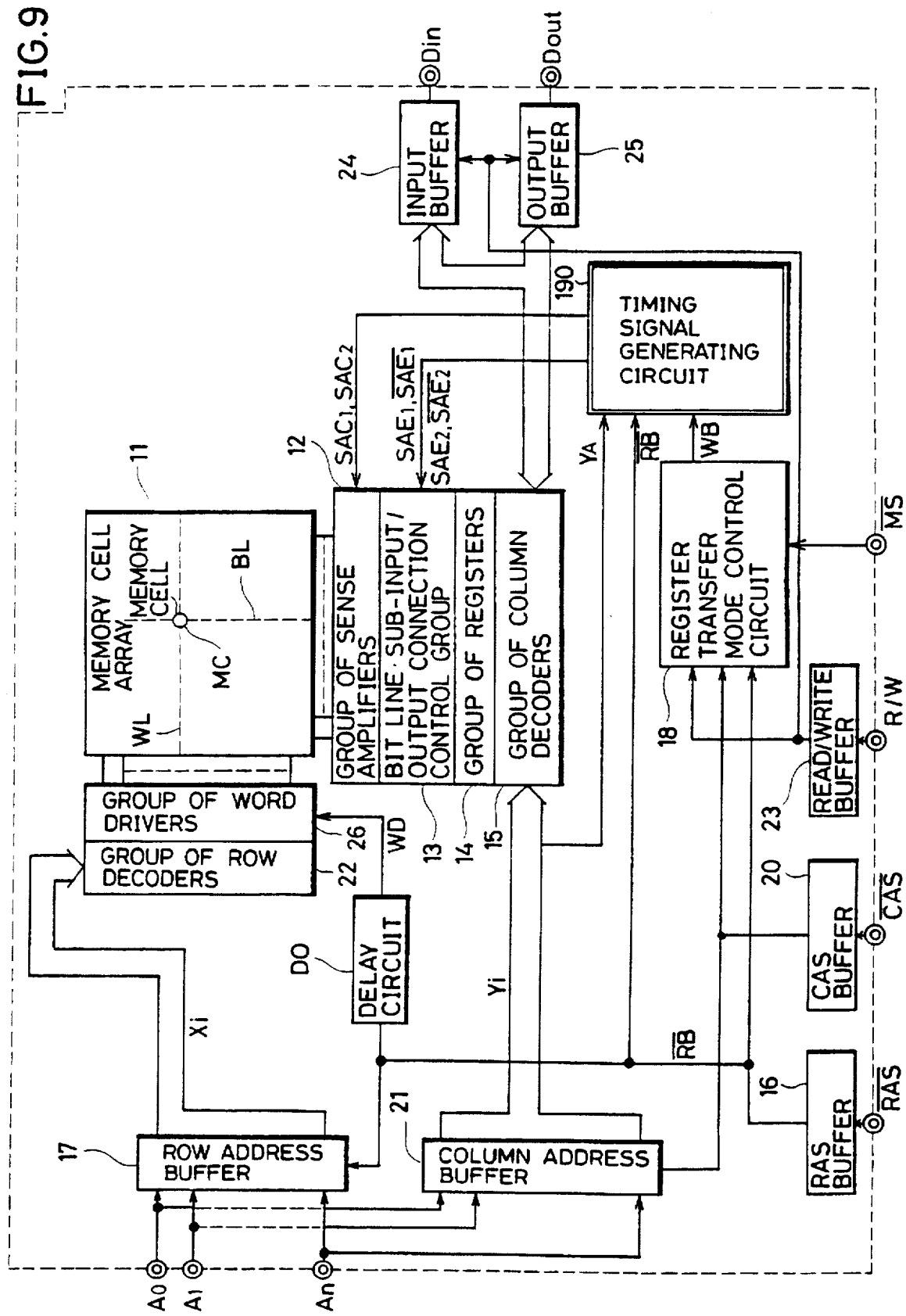
FIG. 9 is a block diagram showing an entire structure of the semiconductor memory device according to the second embodiment of the present invention.

FIG. 9 is a block diagram showing an entire structure of the semiconductor memory device according to the above described second embodiment. In the semiconductor memory device shown in FIG. 9, an output signal $\overline{RB}$ of a RAS buffer 16 becomes a clock signal WB for raising a potential on a word line through a delay circuit DO, which is applied to a group 26 of word drivers. In addition, a timing signal generating circuit 190 is adapted so as to generate sense amplifier connect signals SAC1 and SAC2 and sense amplifier activating signals SAE1 and $\overline{SAE1}$ and SAE2 and $\overline{SAE2}$ in response to the output signal $\overline{RB}$ of the RAS buffer 16, an output signal WB of a register transfer mode control circuit 18 and one $Y_A$ of column address signals Yi. The other structure is the same as that of the semiconductor memory device shown in FIG. 6, and corresponding portions have the same reference numerals and hence, the description thereof is omitted.

Figure 10:
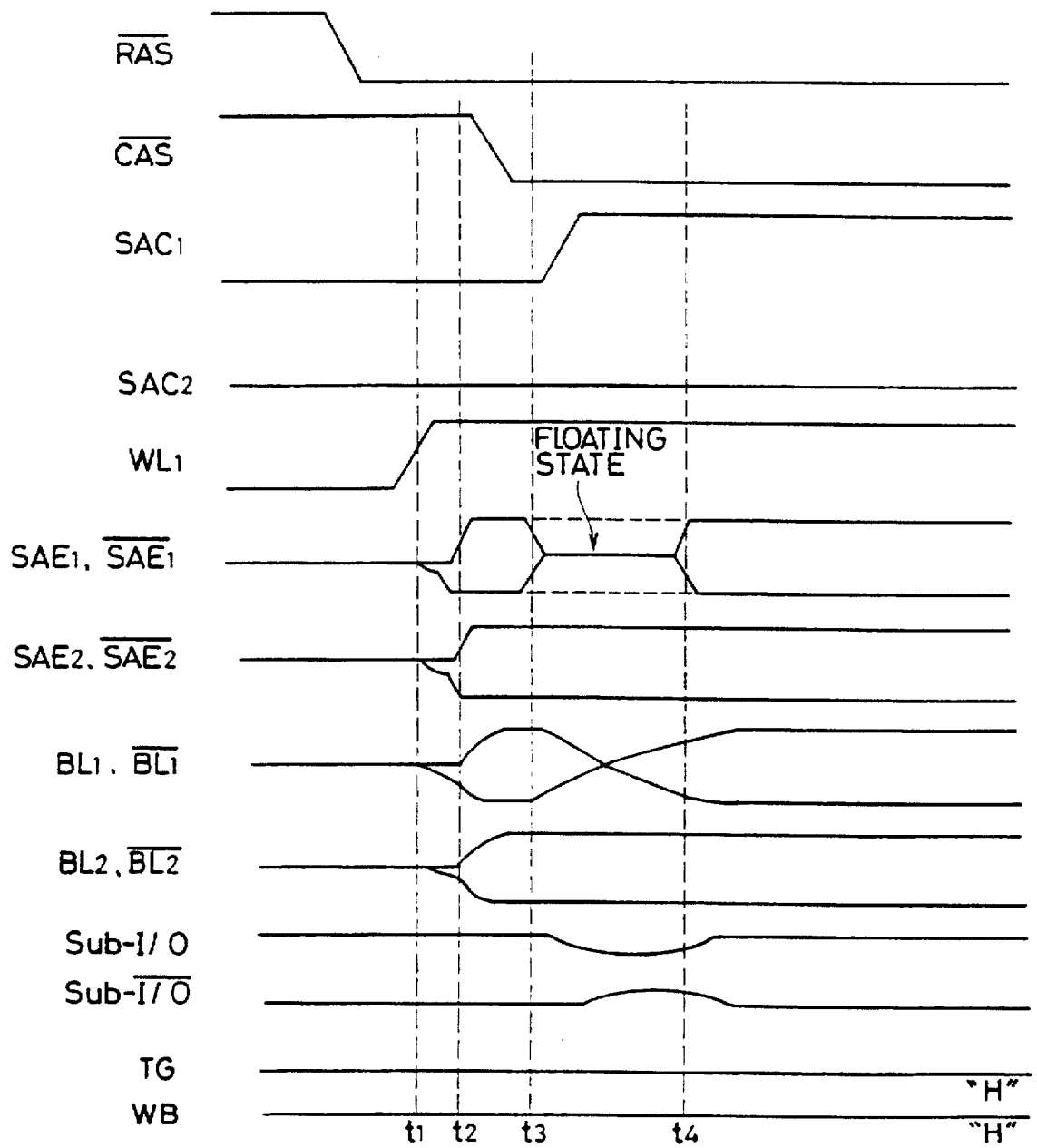
FIG. 10 is a timing chart for explaining an operation of the semiconductor memory device according to the second embodiment of the present invention.

Referring now to a timing chart of FIG. 10, description is made on an operation of the semiconductor memory device according to the second embodiment (see FIGS. 5 and 9). Let us consider a case in which data stored in the register 2 is transferred to the memory cell $MC_{11}$ selected by the word line $WL_1$ and connected to the bit line $BL_1$, as in the above described first embodiment (shown in FIGS. 5 to 8). Meanwhile, in the initial state, it is assumed that the sub-input/output line pair sub.-I/O and sub.-$\overline{I/O}$ respectively become the "H" and "L" levels by the data stored in the register 2, and "L" level data are stored in both the memory cells $MC_{11}$ and $MC_{21}$ selected by the word line $WL_1$.

First, a row address strobe signal $\overline{RAS}$ falls and then, the output signal WD of the delay circuit DO is activated at the time t1, so that the group 26 of word drivers raises the potential on the word line $WL_1$. Then, at the time t2, the timing signal generating circuit 190 respectively brings the sense amplifier activating signals SAE1 and $\overline{SAE1}$ and SAE2 and $\overline{SAE2}$ to the "H" and "L" levels, to activate the sense amplifiers and $3_1$ and $3_2$. Therefore, the data stored in the memory cells $MC_{11}$ and $MC_{21}$ selected by the word line $WL_1$ is once amplified. Then, a column address strobe signal $\overline{CAS}$ falls and then, the timing signal generating circuit 190 raises the sense amplifier connect signal SAC1 based on the column address information $Y_A$ applied from the column address buffer 21, to select the bit line pair $BL_1$ and $\overline{BL_1}$ as a bit line pair connected to the sub-input/output line pair sub. I/O and sub. $\overline{I/O}$ (at the time t3). Since the current handling capability of the register 2 is set higher than that of the sense amplifiers $3_1$, $3_2$, the data stored in the register 2 is transferred onto the bit line pair $BL_1$ and $\overline{BL_1}$. However, in order to transfer the data on the register 2 to the bit line pair $BL_1$ and $BL_2$ the timing signal generating circuit 190 renders the sense amplifier activating signals SAE1 and $\overline{SAE1}$ associated with the selected bit line pair $BL_1$ and $\overline{BL_1}$ electrically floating or brings the same to an intermediate level, thereby to stop activation of the sense amplifier $3_1$. Therefore, a period from t3 to t4 during which the sense amplifier $3_1$ is stopped is to the time when data stored in the memory cell $MC_{11}$ on the bit line pair $BL_1$ and $\overline{BL_1}$ is replaced with the data stored in the register 2. Thereafter, the sense amplifier $3_1$ is activated again, so that the data stored in the register 2 is amplified. The state of the sense amplifier $3_2$ with respect to a non-selected bit line pair $BL_2$ and $\overline{BL_2}$ is maintained, so that data stored in the memory cell $MC_{21}$ is maintained.

Figure 11:
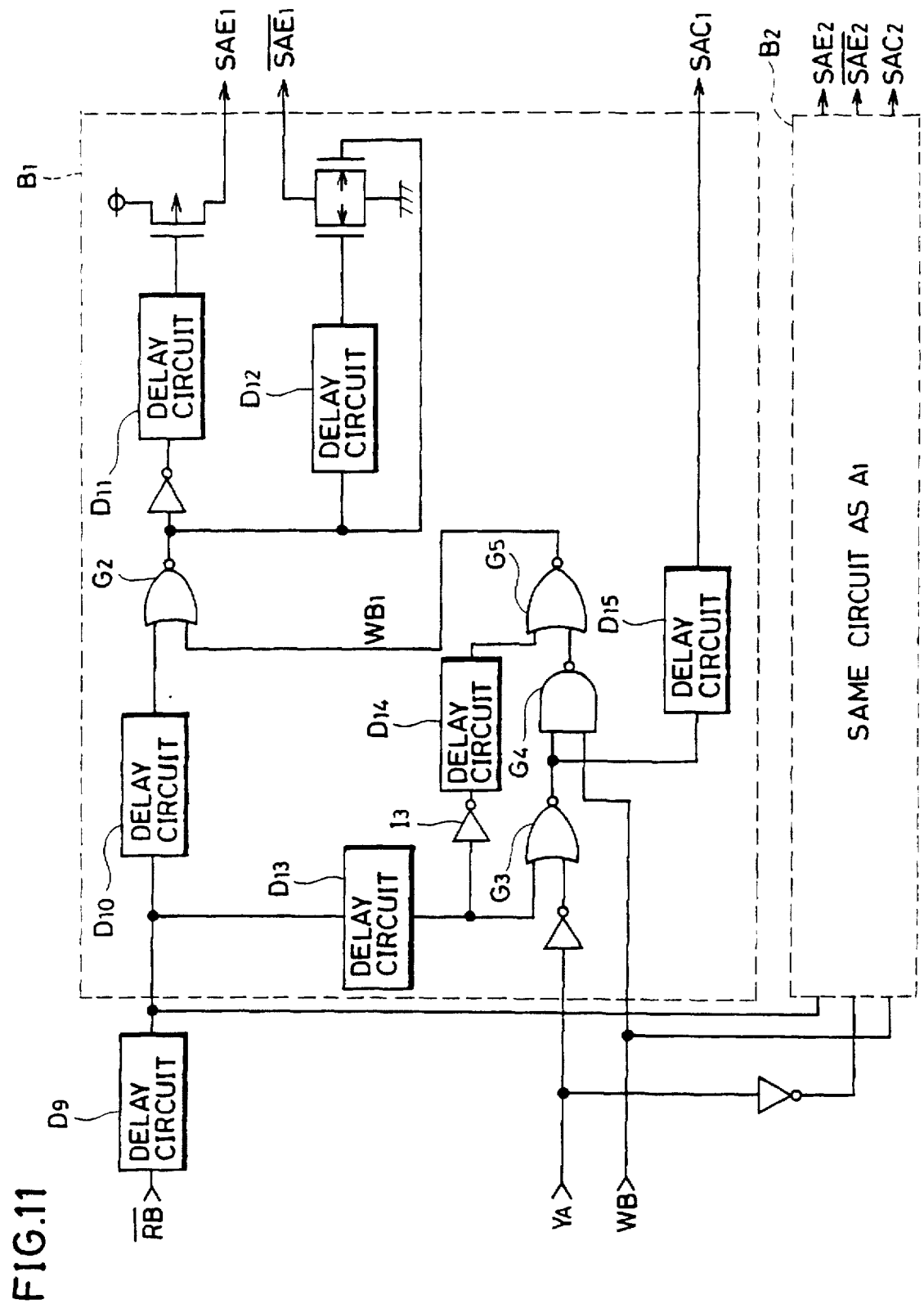
FIG. 11 is a circuit diagram showing one example of a structure of a timing signal generating circuit 190 shown in FIG. 9.

FIG. 11 is a circuit diagram showing one example of a structure of the timing signal generating circuit 190 shown in FIG. 9. Referring now to FIG. 11, the timing signal generating circuit 190 will be described in detail. A signal $\overline{RB}$ is applied to circuits B1 and B2 through a delay circuit D9. The two circuits B1 and B2 have the same structure. The circuits B1 and B2 are adapted so as to respectively generate sense amplifier activating signals SAE1 and SAE2 by NORing by an NOR gate G2 a signal obtained by delaying by a delay circuit D10 an output of the delay circuit D9 and a signal $WB_1$ and delaying an output of the NOR gate G2 by a delay circuit D11. In addition, the circuits B1 and B2 are adapted so as to respectively generate sense amplifier activating signals $\overline{SAE1}$ and $\overline{SAE2}$ by delaying the output of the NOR gate G2 by a delay circuit D12. In this case, in a period during which the signal $WB_1{}'$ becomes the "H" level, the sense amplifier activating signals SAE1 and $\overline{SAE1}$ are rendered electrically floating (a period from t3 to t4 in FIG. 10). The time of rising of this signal $WB_1{}'$ is determined by the delay time of the delay circuit D9 and a delay circuit D13 and three stages of gates (NOR gates G3 and G5 and a NAND gate G4) from the fall of the signal $\overline{RB}$ (i.e., the delay time of a RAS buffer 16 from the fall of the row address strobe signal $\overline{RAS}$). In addition, the fall time thereof is determined by the delay time of the delay circuits D9 and D13, a delay circuit D14 and two stages of gates (an inverter I3 and the NOR gate G5). Thus, a period during which the sense amplifier activating signals SAE1 and $\overline{SAE1}$ are electrically floating (a period during which the signal $WB_1{}'$ is at the "H" level) can be adjusted by the delay circuit D14. On this occasion, the sense amplifier activating signals SAE2 and $\overline{SAE2}$ generated by the circuit B2 are not rendered electrically floating because a signal $WB_2{}'$ (not shown) which corresponds to the signal $WB_1{}'$ in the circuit B1 is always at the "L" level. Meanwhile, an operation performed when the column address signal $Y_A$ is at the "L" level is a reverse of the foregoing. The reason is that an inverted signal of the column address signal $Y_A$ is inputted to the circuit B2. A sense amplifier connect signal SAC1 is generated by NORing by the NOR gate G13 the signal $\overline{RB}$ passing through the delay circuits D9 and D13 and the inverted signal of the column address signal $Y_A$ and delaying an output of the NOR gate G3 by a delay circuit D15. It is the same with the circuit B2.

Figure 12:
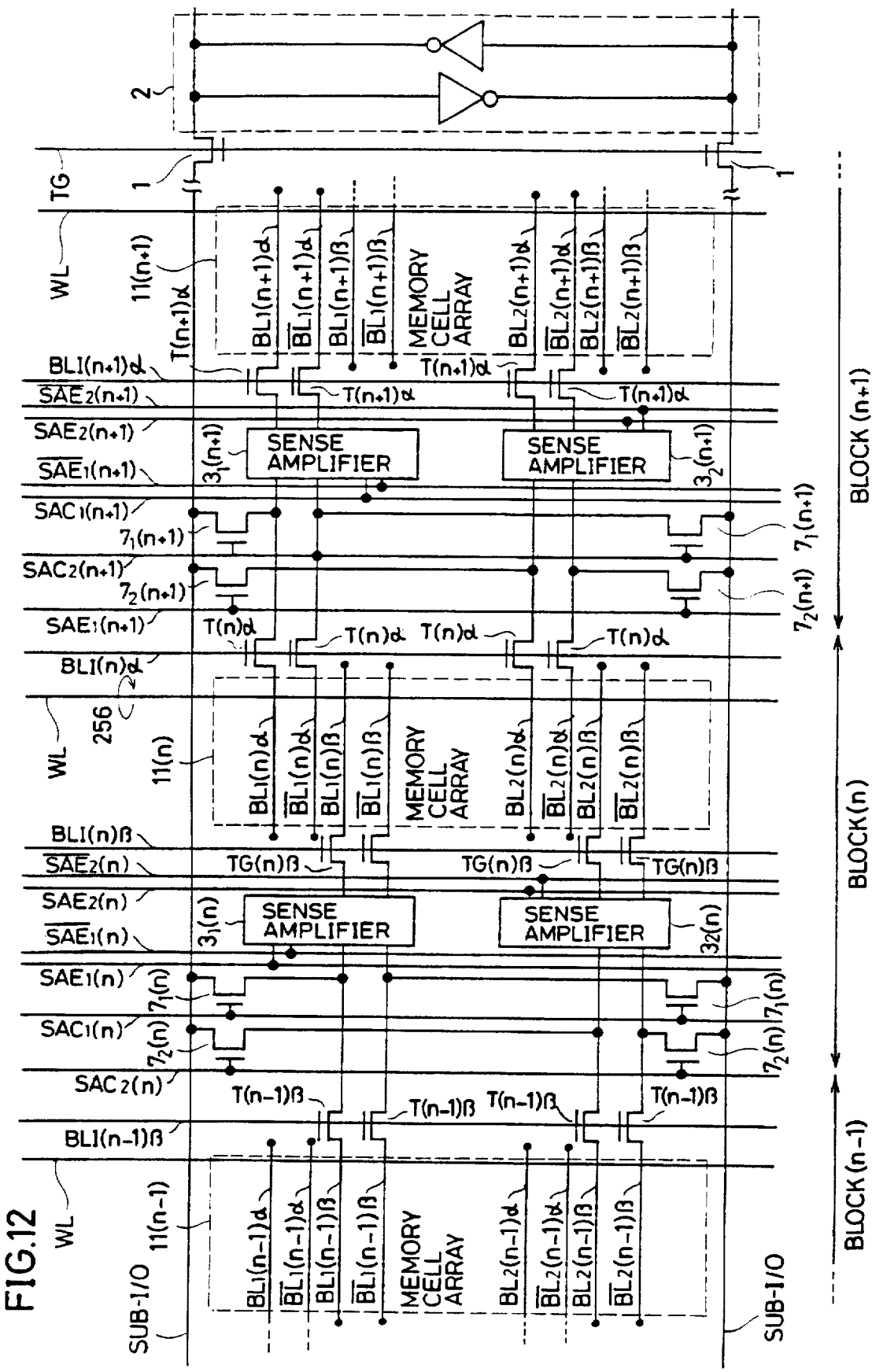
FIG. 12 is a circuit diagram showing a main portion of a semiconductor memory device according to a third embodiment of the present invention.

FIG. 12 is a circuit diagram showing a main portion of a semiconductor memory device according to a third embodiment of the present invention. In the third embodiment, on both sides of each of a plurality of sense amplifiers, bit line pairs are connected to each other through transfer gates. The plurality of sense amplifiers and the bit line pairs connected thereto are arranged in a double line between a sub-input/output line pair sub -I/O and sub -$\overline{I/O}$. For example, on both sides of a sense amplifier $3_1$ (n), bit line pairs $BL_1$ (n−1) β and $BL_1$ (n−1) β and $BL_1$ (n) β and $\overline{BL_1}$ (n) β are connected to each other through transfer gates T (n−1) β and T (n) β. In addition, with respect to a block (n), two bit line pairs $BL_1$ (n) β and $\overline{BL_1}$ (n) β and $BL_2$ (n) β and $\overline{BL_2}$ (n) β or two bit line pairs $BL_1$ (n) α and $\overline{BL_1}$ (n) α and $BL_2$ (n) α and $\overline{BL_2}$ are arranged between a sub-input/output line pair sub -I/O and sub -$\overline{I/O}$. The bit line pairs, a plurality of word lines WL (only one word line is shown in the figure) and memory cells (not shown) constitute a memory cell array 11 (n). It is the same with another block. On-off control of each of the transfer gates T (n−1) β, T (n) β, T (n) α and T (n+1) α is controlled by bit line disconnecting signals BLI (n−1) β, BLI (n) β, BLI (n) α and BLI (n+1) α, respectively. In addition, the sub-input/output line pair sub -I/O and sub -$\overline{I/O}$ is connected to the bit line pairs $BL_1$ (n−1) β and $\overline{BL_1}$ (n−1) β, $BL_2$ (n−1) β and $\overline{BL_2}$ (n−1) β, $BL_1$ (n) α and $\overline{BL_1}$ (n) α and $BL_2$ (n) α and $BL_2$ (n) α through transfer gates $7_1$ (n), $7_2$ (n), $7_1$ (n+1) and $7_2$ (n+1), respectively. On-off control of the transfer gates $7_1$ (n), $7_2$ (n), $7_1$ (n+1) and $7_2$ (n+1) is controlled by sense amplifier connect signals SAC1 (n), SAC2 (n), SAC1 (n+1) and SAC2 (n+1), respectively. Furthermore, sense amplifiers $3_1$ (n), $3_2$ (n), $3_1$ (n+1) and $3_2$ (n+1) are respectively activated by sense amplifier activating signals SAE1 (n) and $\overline{SAE1}$ (n), SAE2 (n) and $\overline{SAE2}$ (n), SAE1 (n+1) and $\overline{SAE1}$ (n+1), and SAE2 (n+1) and $\overline{SAE2}$ (n+1). In addition, the sub-input/output line pair sub -I/O and sub -$\overline{I/O}$ is connected to a register 2 through transfer gates 1.

As shown in the lower portion of FIG. 12, this semiconductor memory device has a plurality of blocks . . . . , (n−1), (n), (n+1), . . . . , each of the blocks having the same circuit structure. Reading/writing of data is controlled to be performed every memory cell array . . . . 11 (n−1), 11 (n), 11(n+1), . . . in each of the blocks.

Figure 13:
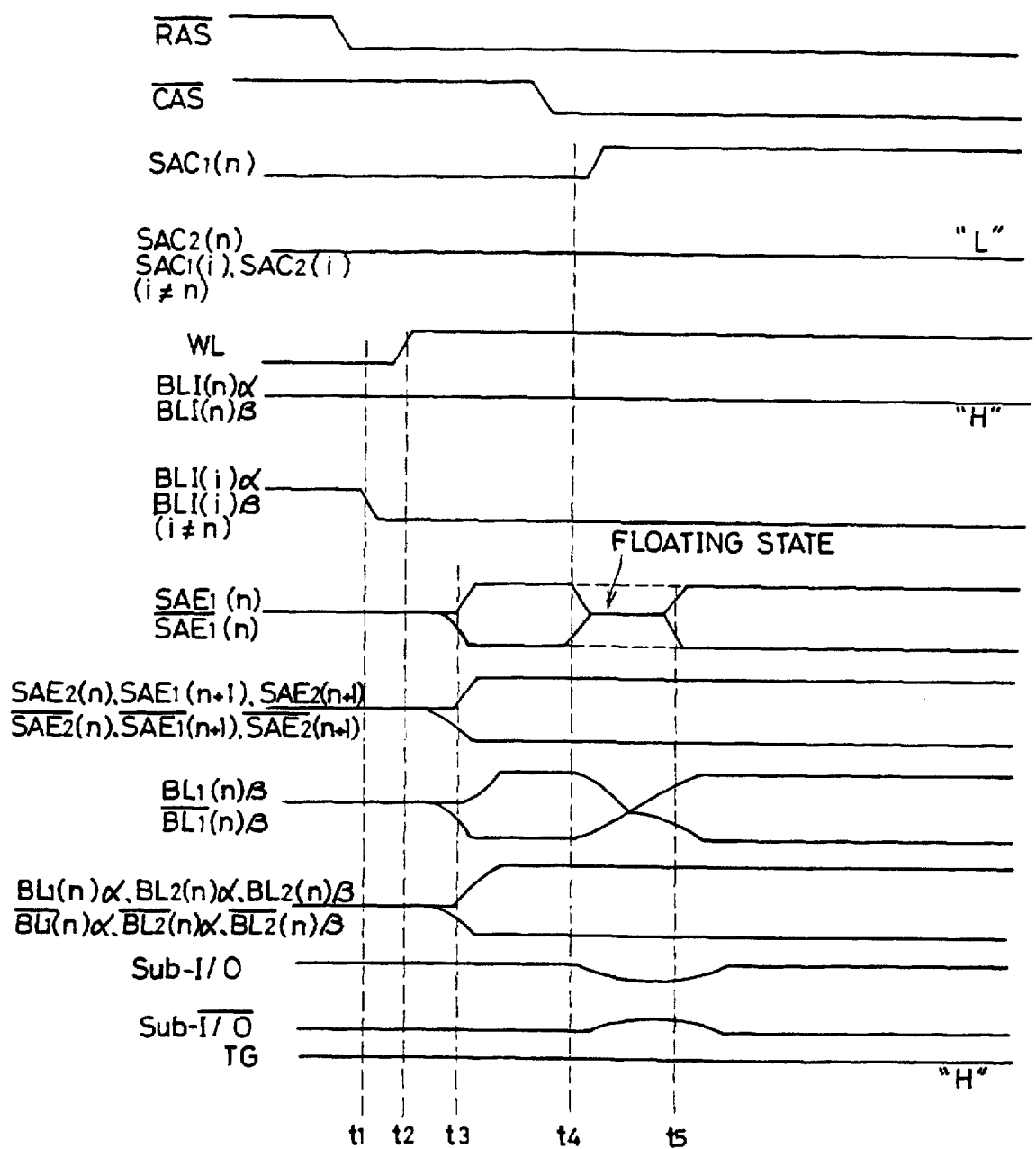
FIG. 13 is a timing chart for explaining an operation of the semiconductor memory device according to the third embodiment of the present invention.

Referring now to a timing chart of FIG. 13, description is made on an operation for transferring and writing data from the register 2 to memory cells in the embodiment shown in FIG. 12. As an example, let us consider a case in which data stored in the register 2 is transferred to memory cells belonging to the bit line pair $BL_1$ (n) β and $\overline{BL_1}$ (n) β in the block (n). Meanwhile, in the initial state, it is assumed that the sub-input/output lines sub -I/O and sub -$\overline{I/O}$ are respectively at the "H" and "L" levels depending on the data stored in the register 2, and "L" level data are stored in all the memory cells belonging to the bit line pair $BL_1$ (n) β and $\overline{BL_1}$ (n) β.

First, the row address strobe signal $\overline{RAS}$ rises and then, the block (n) is selected based on information stored in a row address. At the time t1, signals BLI (i) α and BLI (i) β (where i≠n) other than the bit line disconnecting signals BLI (n) α and BLI (n) β are brought to the "L" level. Thereafter, at the time t2, a potential on a given word line WL in the block (n) rises. Then, at the time t3, the sense amplifier activating signals SAE1 (n), SAE2 (n), SAE1 (n+1) and SAE2 (n+1) and $\overline{SAE1}$(n), $\overline{SAE2}$(n), $\overline{SAE1}$(n+1) and $\overline{SAE2}$(n+2) are respectively brought to the "H" and "L" levels in order to activate the sense amplifiers $3_1$ (n), $3_2$ (n), $3_1$ (n+1) and $3_2$ (n+1) which can be connected to the bit line pairs in the block (n). Consequently, data in memory cells are once amplified and detected. On this occasion, another sense amplifier is not activated. More specifically, another sense amplifier activating signal remains at an intermediate level, and bit line pairs in a block i (i≠n) remain at an intermediate level. Thereafter, the column address strobe signal $\overline{CAS}$ falls. At the time t4, the sense amplifier connect signal SAC1 (n) is raised based on information stored in a column address. Consequently, the bit line pair $BL_1$ (n) β and $\overline{BL_1}$(n)B is selected as a bit line pair connected to the sub-input/output line pair sub.-I/O and sub.-$\overline{I/O}$. On this occasion, only the sense amplifier activating signals SAE1 (n) and $\overline{SAE1}$ (n) associated with the selected bit line pair $BL_1$ (n) β and $\overline{BL_1}$ (n) β are rendered electrically floating or brought to an intermediate level, to stop activation of the sense amplifier $3_1$ (n), whereby the data stored in the register 2 is transferred to the bit line pair $BL_1$ (n) β and $\overline{BL_1}$ (n) β. A period from t4 to t5 during which the sense amplifier $3_1$ (n) is being stopped is to the time when data stored in the memory cell on the bit line pair $BL_1$ (n) β and $\overline{BL_1}$ (n) β is replaced with the data stored in the register 2. Thereafter, the sense amplifier $3_1$ (n) is activated again, to amplify the data stored in the register 2.

As described in the foregoing, in the embodiment shown in FIG. 12, a group of bit line pairs is divided into a plurality of blocks, blocks other than a block including a selected bit line pair are disconnected by transfer gates, and a sense amplifier connected to the bit line pair in the selected block is controlled, so that data can be transferred to memory cells from the register 2. In this case, sense amplifiers are independently driven by separate sense amplifier activating signals, so that data stored in a memory cell belonging to a non-selected bit line pair is prevented from being undesirably destroyed.

Although to the above described third embodiment, the transferring method (see FIG. 10) in the above described second embodiment is applied, the transferring method (see FIG. 7) in the first embodiment may be applied, to obtain the same effect. Even if the transferring method in the first embodiment is applied, the same circuit as that shown in FIG. 12 can be used as a major circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory apparatus having a hierarchical data organization comprising:

a data register;

a plurality of memory cells;

a plurality of sense amplifiers;

a plurality of transfer gates;

a plurality of word lines and bit line pairs;

a pair of sub-I/O lines;

said plurality of sense amplifiers, transfer gates and corresponding bit line pairs being connected to respective memory cells to receive data from said register over said pair of sub-I/O lines, said memory apparatus having one of said sense amplifiers associated with each pair of said bit lines; wherein all the memory cells connected to a selected word line are selected;

means for selecting memory cells by activation of a respective word line;

a plurality of sense amplifier activation circuits generating distinct sense amplifier control signals, each sense amplifier control signal being distinct for each sense amplifier associated with a common pair of sub-I/O lines; and said plurality of sense amplifier activation circuits being connected to said sense amplifiers and generating said distinct sense amplifier control signals, wherein each sense amplifier corresponding to one pair of said sub-I/O lines may be activated separately from other sense amplifiers corresponding to the same pair of sub-I/O lines and the one pair of said sub-I/O lines is connected to a bit line pair corresponding to a selected memory cell before activation of any of the plurality of sense amplifiers, wherein said sense amplifier activation circuits receive corresponding activating signals, said means for controlling said sense amplifier activation circuits include timing signal generating means for controlling timing of said corresponding sense amplifier activating signals connected to respective ones of said sense amplifier activation circuits.

2. A memory apparatus as recited in claim 1, wherein said means for controlling said sense amplifier activation circuits include means for establishing a plurality of activation states of said plurality of sense amplifiers, and delay means for establishing a time differential between activation states between a first sense amplifier corresponding to a bit line pair having a selected memory cell and at least one second sense amplifier corresponding to another bit line pair.

3. A memory apparatus as recited in claim 2, wherein said delay means includes means for establishing a time differential between the activation times between said first and said second sense amplifiers when a sense amplifier connect signal actuates at least some of said transfer gates prior to activation of a word line corresponding to said selected memory cell in a single memory access cycle.

4. A memory apparatus as recited in claim 2, wherein said delay means includes means for establishing a time differential between the activation time of said second sense amplifier and the time said first sense amplifier is brought to a floating state when a word line corresponding to said selected memory cell is activated prior to activation of at least some of said transfer gates by a sense amplifier connect signal in a single memory access cycle.

5. A memory apparatus as recited in claim 2, wherein said delay means includes means for controlling the time of activation of at least one of said first and second sense amplifiers for refreshing data in a memory cell corresponding to the intersection of an activated word line and a bit line pair corresponding to said at least one of said first and second sense amplifiers.

6. A semiconductor memory device comprising a random access memory and a serial access memory, wherein said random access memory includes:

M×N memory cells arranged in M rows and N ($=N_1 \times N_2$) columns to form a matrix and divided into $N_2$ memory cell groups each including, for every $N_1$ columns;

N bit line pairs arranged in N columns and each connected to M memory cells arranged in corresponding columns;

M word lines arranged in M rows and each connected to N memory cells arranged in corresponding rows;

N sense amplifiers arranged in N columns and each connected to bit line pairs arranged in corresponding columns; and $N_2$ sub data line pairs, each corresponding respectively, to one of said $N_2$ groups of said M×N memory cells and each connected through first transfer gate means to $N_1$ bit line pairs connected to memory cells in corresponding groups; and wherein said serial access memory includes:

$N_2$ storage means each corresponding to said $N_2$ sub data line pairs in said random access memory and each connected through second transfer gate means to corresponding sub data line pairs;

$N_1$ sense amplifier activating signal lines each connected to a different one of the N sense amplifiers and corresponding respectively, to one of $N_2$ columns, for transmitting signals for activating the connected sense amplifiers, each of signals for activating the connected sense amplifier being provided separately through a respective sense amplifier activating signal line and a respective sub data line pair being connected to a bit line pair corresponding to a selected memory cell before activation of any of the N of sense amplifiers, and timing signal generating means for controlling timing of said signals for activating said plurality of sense amplifiers.

7. A semiconductor memory device comprising a random access memory and a serial access memory, wherein said random access memory includes:

M×N memory cells arranged in M rows and N ($=N_1 \times N_2$) columns to form a matrix and divided into $N_2$ memory cell groups each including, for every $N_1$ columns;

N bit line pairs arranged in N columns and each connected to M memory cells arranged in corresponding columns;

M word lines arranged in M rows and each connected to N memory cells arranged in corresponding rows;

N sense amplifiers arranged in N columns and each connected to bit line Pairs arranged in corresponding columns; and $N_2$ sub data line pairs, each corresponding respectively, to one of said $N_2$ groups of said M×N memory cells and each connected through first transfer gate means to $N_1$ bit line pairs connected to memory cells in corresponding groups; and wherein said serial access memory includes:

$N_2$ storage means each corresponding to said $N_2$ sub data line pairs in said random access memory and each connected through second transfer gate means to corresponding sub data line pairs;

$N_1$ sense amplifier activating signal lines each connected to a different one of the N sense amplifiers and corresponding respectively, to one of $N_2$ columns, for transmitting signals for activating the connected sense amplifiers, each of signals for activating the connected sense amplifier being provided separately through a respective sense amplifier activating signal line and a respective sub data line pair being connected to a bit line pair corresponding to a selected memory cell before activation of any of the N of sense amplifiers, and means for controlling activation of the connected sense amplifiers for establishing a plurality of activation states, and delay means for establishing a time differential between activation states between a first sense amplifier corresponding to 35 a bit line pair having a selected memory cell and at least one second sense amplifier corresponding to another bit line pair.

8. The semiconductor memory device according to claim 7, wherein said delay means includes means for establishing a time differential between the activation times between the first and said second sense amplifiers when a sense amplifier connect signal activates at least some of said first transfer gate means prior to activation of a word line corresponding to said selected memory cell in a single memory access cycle.

9. The semiconductor memory device according to claim 7, wherein said delay means includes means for establishing a time differential between the activation times of said second sense amplifier and the time said first sense amplifier is brought to a floating state when a word line corresponding to said selected memory cell is activated prior to activation of at least some of said transfer gates by a sense amplifier connect signal in a single memory access cycle.

10. The semiconductor memory device according to claim 7, wherein said delay means includes means for controlling the time of activation of at least one of said first and second sense amplifiers for refreshing data in a memory cell corresponding to the intersection of an activated word line and a bit line pair corresponding to said at least one of said first and second sense amplifiers.

* * * * *